(12) United States Patent
Cheadle

(10) Patent No.: US 11,031,938 B2
(45) Date of Patent: Jun. 8, 2021

(54) RADIO FREQUENCY SYNCHRONIZATION IN LOW-POWER AND LOSSY NETWORKS

(71) Applicant: Cisco Technology, Inc., San Jose, CA (US)

(72) Inventor: Christopher Scott Atherton Cheadle, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/663,644

(22) Filed: Oct. 25, 2019

(65) Prior Publication Data

US 2021/0126642 A1 Apr. 29, 2021

(51) Int. Cl.
*H03B 5/32* (2006.01)
*H03L 1/02* (2006.01)
(Continued)

(52) U.S. Cl.
CPC .............. *H03L 1/023* (2013.01); *H03B 5/368* (2013.01); *H03L 1/028* (2013.01); *H04L 27/2657* (2013.01); *H04L 27/2672* (2013.01); *H04W 16/32* (2013.01); *H04W 56/0015* (2013.01); *H04W 56/0035* (2013.01)

(58) Field of Classification Search
CPC . H03B 5/32; H03B 5/36; H03B 5/362; H03B 5/364; H03B 5/366; H03B 5/368; H03L 1/02; H03L 1/023; H03L 1/025–028; H04L 27/2657; H04L 27/2672; H04W 4/70; H04W 16/32; H04W 24/02; H04W 24/04; H04W 56/00; H04W 56/001; H04W 56/0015; H04W 56/002;
(Continued)

(56) References Cited

U.S. PATENT DOCUMENTS 5,113,416 A * 5/1992 Lindell ................. H03J 1/0008
331/158
5,617,084 A * 4/1997 Sears ..................... G08C 15/00
331/176

(Continued)

OTHER PUBLICATIONS

C. Travis, "Automatic Frequency Control", IEEE, Proceedings of the Institute of Radio Engineers, vol. 23, Issue: 10, Oct. 1935, pp. 1125-1141.

(Continued)

*Primary Examiner* — Levi Gannon
(74) *Attorney, Agent, or Firm* — Behmke Innovation Group LLC; Kenneth J. Heywood; Jonathon P. Western

(57) ABSTRACT

In one embodiment, a device in a low-power and lossy network (LLN) makes, based on a temperature measurement, a first adjustment to a frequency for a wireless channel used by the device to communicate with one or more neighboring devices in the LLN. The device receives, via the wireless channel, a packet from one of the neighboring devices that indicates a transmit frequency for the packet. The device calculates a frequency offset based on a difference between the transmit frequency for the packet and the adjusted frequency for the wireless channel. The device makes, based on the calculated frequency offset, a second adjustment to the frequency for the wireless channel used by the device to communicate with the one or more neighboring devices in the LLN.

15 Claims, 12 Drawing Sheets

(51) Int. Cl.
*H04W 16/32* (2009.01)
*H04W 56/00* (2009.01)
*H03B 5/36* (2006.01)
*H04L 27/26* (2006.01)

(58) Field of Classification Search
CPC . H04W 56/0035; H04W 92/04; H04W 92/16; H04W 92/18
USPC .................................................. 331/158, 176
See application file for complete search history.

(56) References Cited

U.S. PATENT DOCUMENTS

| | | | |
|---|---|---|---|
| 5,673,252 A * | 9/1997 | Johnson | G01D 4/004 370/346 |
| 7,764,714 B2 * | 7/2010 | Monier | H04W 40/22 370/516 |
| 7,791,419 B1 | 9/2010 | Lemkin | |
| 8,351,409 B2 | 1/2013 | Albert et al. | |
| 8,699,406 B1 * | 4/2014 | Charles | H04L 7/048 370/324 |
| 9,289,422 B2 | 3/2016 | Ben-Eli et al. | |
| 9,425,652 B2 * | 8/2016 | Rippon | H02J 13/0013 |
| 10,039,018 B2 | 7/2018 | Splitz et al. | |
| 2002/0180535 A1 * | 12/2002 | Barak | H03L 1/026 331/25 |
| 2006/0234737 A1 * | 10/2006 | Neumann | H03J 7/02 455/502 |
| 2007/0155413 A1 * | 7/2007 | Kerstenbeck | H03L 1/02 455/502 |
| 2009/0225743 A1 * | 9/2009 | Nicholls | H04J 3/0688 370/350 |
| 2010/0202436 A1 * | 8/2010 | Albert | H04J 3/0655 370/350 |
| 2013/0016757 A1 * | 1/2013 | Hui | H04B 1/7156 375/134 |
| 2015/0103965 A1 * | 4/2015 | Chari | H04L 27/2657 375/371 |
| 2015/0378322 A1 * | 12/2015 | Bruins | G04R 20/00 368/47 |
| 2016/0020800 A1 * | 1/2016 | Krishnamoorthy | H04B 1/3816 455/423 |
| 2019/0246367 A1 * | 8/2019 | Vilajosana Guillen | H04W 56/0015 |

OTHER PUBLICATIONS

Watteyne et al., "Crystal-Free Network Synchronization", Transactions on Emerging Telecommunications Technologies, Trans. Emerging Tel. Tech. 2016, pp. 1-13.

Kim et al., "Distributed Frequency Synchronization for Global Synchronization in Wireless Mesh Networks", World Academy of Science, Engineering and Technology, International Journal of Electrical, Computer, Energetic, Electronic and Communication Engineering vol. 6, No. 10, 2012, pp. 1211-1215.

Mehta et al., "Frequency Offset Compensation for Crystal-free 802.15.4 Communication", 2011 International Conference on Advanced Technologies for Communications (ATC 2011), IEEE, pp. 45-47.

"SX1276/77/78/79—137 MHz to 1020 MHz Low Power Long Range Transceiver", Semtech, Wireless & Sensing Products, Datasheet, Rev. 6, Jan. 2019, pp. 1-132.

* cited by examiner

RADIO FREQUENCY SYNCHRONIZATION IN LOW-POWER AND LOSSY NETWORKS

TECHNICAL FIELD

The present disclosure relates generally to computer networks, and, more particularly, to radio frequency synchronization in Low-Power and Lossy Networks.

BACKGROUND

Low power and Lossy Networks (LLNs), e.g., sensor networks, have a myriad of applications, such as Smart Grid and Smart Cities. Various challenges are presented with LLNs, such as lossy links, low bandwidth, battery operation, low memory and/or processing capability of a device, etc. Changing environmental conditions may also affect device communications. For example, physical obstructions (e.g., changes in the foliage density of nearby trees, the opening and closing of doors, etc.), changes in interference (e.g., from other wireless networks or devices), propagation characteristics of the media (e.g., temperature or humidity changes, etc.), and the like, also present unique challenges to LLNs.

In contrast to many traditional computer networks, LLN devices typically communicate via shared-media links. For example, LLN devices that communicate wirelessly may communicate using overlapping wireless channels (e.g., frequencies). Unfortunately, the very nature of many LLN devices has also led to some LLN devices causing interference. Indeed, many LLN devices are equipped with low-cost crystal oscillators for their transceivers that can result in large frequency drifts due to temperature changes, unit-to-unit variations, aging, or supply voltage. This can be particularly troublesome in narrow-band, low data rate networks where the frequency error of the crystal may consume a large fraction of the channel bandwidth.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

Figure 1:
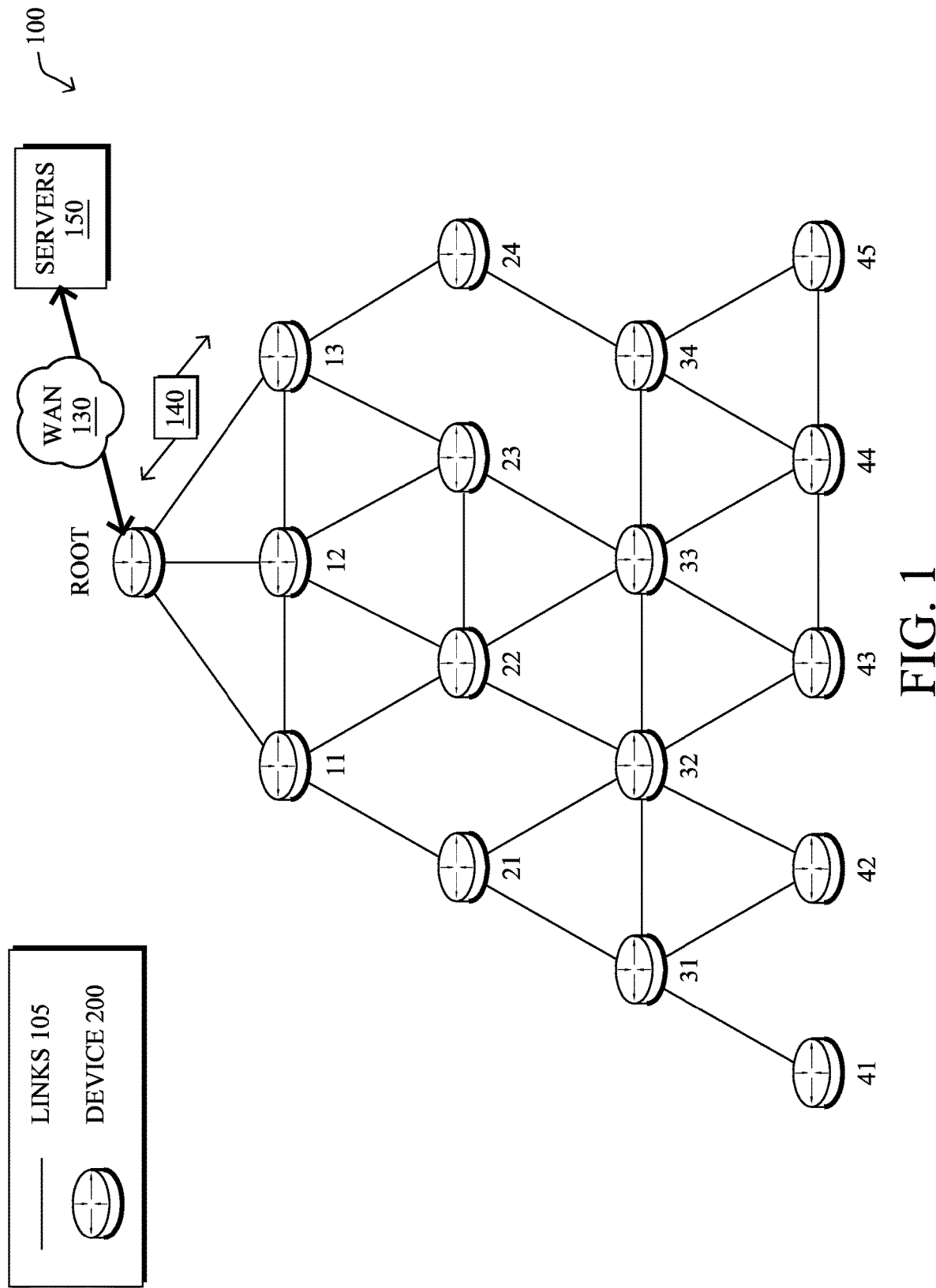
FIG. 1 illustrates an example computer network.

According to one or more embodiments of the disclosure, a device in a low-power and lossy network (LLN) makes, based on a temperature measurement, a first adjustment to a frequency for a wireless channel used by the device to communicate with one or more neighboring devices in the LLN. The device receives, via the wireless channel, a packet from one of the neighboring devices that indicates a transmit frequency for the packet. The device calculates a frequency offset based on a difference between the transmit frequency for the packet and the adjusted frequency for the wireless channel. The device makes, based on the calculated frequency offset, a second adjustment to the frequency for the wireless channel used by the device to communicate with the one or more neighboring devices in the LLN.

Description

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC) such as IEEE 61334, IEEE 1901.2, and others. In addition, a Mobile Ad-Hoc Network (MANET) is a kind of wireless ad-hoc network, which is generally considered a self-configuring network of mobile routers (and associated hosts) connected by wireless links, the union of which forms an arbitrary topology.

Smart object networks, such as sensor networks, in particular, are a specific type of network having spatially distributed autonomous devices such as sensors, actuators, etc., that cooperatively monitor physical or environmental conditions at different locations, such as, e.g., energy/power consumption, resource consumption (e.g., water/gas/etc. for advanced metering infrastructure or "AMI" applications) temperature, pressure, vibration, sound, radiation, motion, pollutants, etc. Other types of smart objects include actuators, e.g., responsible for turning on/off an engine or perform any other actions. Sensor networks, a type of smart object network, are typically shared-media networks, such as wireless or PLC networks. That is, in addition to one or more sensors, each sensor device (node) in a sensor network may generally be equipped with a radio transceiver or other communication port such as PLC, a microcontroller, and an energy source, such as a battery. Often, smart object networks are considered field area networks (FANs), neighborhood area networks (NANs), personal area networks (PANs), etc. Generally, size and cost constraints on smart object nodes (e.g., sensors) result in corresponding constraints on resources such as energy, memory, computational speed and bandwidth.

FIG. 1 is a schematic block diagram of an example computer network 100 illustratively comprising nodes/devices 110 (e.g., labeled as shown, "root," "11," "12," . . . "45," and described in FIG. 2 below) interconnected by various methods of communication. For instance, the links 105 may be wired links or shared media (e.g., wireless links, PLC links, etc.) where certain nodes 110, such as, e.g., routers, sensors, computers, etc., may be in communication with other nodes 110, e.g., based on distance, signal strength, current operational status, location, etc. The illustrative root node, such as a field area router (FAR) of a FAN, may interconnect the local network with a WAN 130, which may house one or more other relevant devices such as management devices or servers 150, e.g., a network management server (NMS), a dynamic host configuration protocol (DHCP) server, a constrained application protocol (CoAP) server, etc. Those skilled in the art will understand that any number of nodes, devices, links, etc. may be used in the computer network, and that the view shown herein is for simplicity. Also, those skilled in the art will further understand that while the network is shown in a certain orientation, particularly with a "root" node, the network 100 is merely an example illustration that is not meant to limit the disclosure.

Data packets 140 (e.g., traffic and/or messages) may be exchanged among the nodes/devices of the computer network 100 using predefined network communication protocols such as certain known wired protocols, wireless protocols (e.g., IEEE Std. 802.15.4, WiFi, Bluetooth®, etc.), PLC protocols, or other shared-media protocols where appropriate. In this context, a protocol consists of a set of rules defining how the nodes interact with each other.

Figure 2:
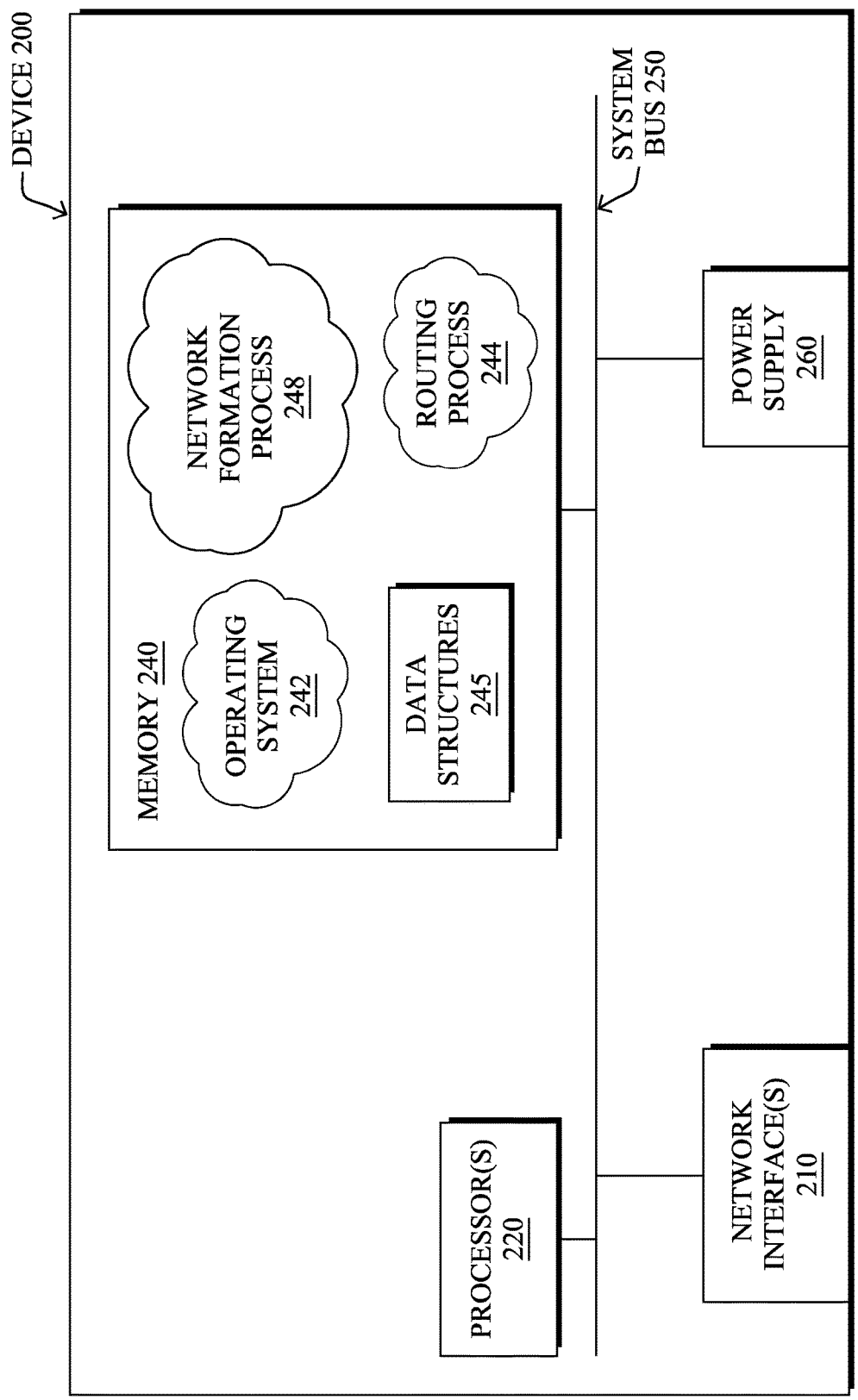
FIG. 2 illustrates an example network device/node.

FIG. 2 is a schematic block diagram of an example node/device 200 that may be used with one or more embodiments described herein, e.g., as any of the nodes shown in FIG. 1 above. The device may comprise one or more network interfaces 210 (e.g., wired, wireless, PLC, etc.), at least one processor 220, and a memory 240 interconnected by a system bus 250, as well as a power supply 260 (e.g., battery, plug-in, etc.).

The network interface(s) 210 contain the mechanical, electrical, and signaling circuitry for communicating data over links 105 coupled to the network 100. The network interfaces may be configured to transmit and/or receive data using a variety of different communication protocols. Note, further, that the nodes may have two different types of network connections 210, e.g., wireless and wired/physical connections, and that the view herein is merely for illustration.

The memory 240 comprises a plurality of storage locations that are addressable by the processor 220 and the network interfaces 210 for storing software programs and data structures associated with the embodiments described herein. Note that certain devices may have limited memory or no memory (e.g., no memory for storage other than for programs/processes operating on the device and associated caches). The processor 220 may comprise hardware elements or hardware logic adapted to execute the software programs and manipulate the data structures 245. An operating system 242, portions of which are typically resident in memory 240 and executed by the processor, functionally organizes the device by, inter alia, invoking operations in support of software processes and/or services executing on the device. These software processes and/or services may comprise a routing process/services 244 and an illustrative network formation process 248, either of which may be implemented as part of network interface(s) 210, in various embodiments.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

Routing process (services) 244 contains computer executable instructions executed by the processor 220 to perform functions provided by one or more routing protocols, such as proactive or reactive routing protocols as will be understood by those skilled in the art. These functions may, on capable devices, be configured to manage a routing/forwarding table (a data structure 245) containing, e.g., data used to make routing/forwarding decisions. In particular, in proactive routing, connectivity is discovered and known prior to computing routes to any destination in the network, e.g., link state routing such as Open Shortest Path First (OSPF), or Intermediate-System-to-Intermediate-System (ISIS), or Optimized Link State Routing (OLSR). Reactive routing, on the other hand, discovers neighbors (i.e., does not have an a priori knowledge of network topology), and in response to a needed route to a destination, sends a route request into the network to determine which neighboring node may be used to reach the desired destination. Example reactive routing protocols may comprise Ad-hoc On-demand Distance Vector (AODV), Dynamic Source Routing (DSR), DYnamic MANET On-demand Routing (DYMO), etc. Notably, on devices not capable or configured to store routing entries, routing process 244 may consist solely of providing mechanisms necessary for source routing techniques. That is, for source routing, other devices in the network can tell the less capable devices exactly where to send the packets, and the less capable devices simply forward the packets as directed.

Low power and Lossy Networks (LLNs), e.g., certain sensor networks, may be used in a myriad of applications such as for "Smart Grid" and "Smart Cities." A number of challenges in LLNs have been presented, such as:

1) Links are generally lossy, such that a Packet Delivery Rate/Ratio (PDR) can dramatically vary due to various sources of interferences, e.g., considerably affecting the bit error rate (BER);

2) Links are generally low bandwidth, such that control plane traffic must generally be bounded and negligible compared to the low rate data traffic;

3) There are a number of use cases that require specifying a set of link and node metrics, some of them being dynamic, thus requiring specific smoothing functions to avoid routing instability, considerably draining bandwidth and energy;

4) Constraint-routing may be required by some applications, e.g., to establish routing paths that will avoid non-encrypted links, nodes running low on energy, etc.;

5) Scale of the networks may become very large, e.g., on the order of several thousands to millions of nodes; and 6) Nodes may be constrained with a low memory, a reduced processing capability, a low power supply (e.g., battery).

In other words, LLNs are a class of network in which both the routers and their interconnect are constrained: LLN routers typically operate with constraints, e.g., processing power, memory, and/or energy (battery), and their interconnects are characterized by, illustratively, high loss rates, low data rates, and/or instability. LLNs are comprised of anything from a few dozen and up to thousands or even millions of LLN routers, and support point-to-point traffic (between devices inside the LLN), point-to-multipoint traffic (from a central control point to a subset of devices inside the LLN) and multipoint-to-point traffic (from devices inside the LLN towards a central control point).

An example implementation of LLNs is an "Internet of Things" network. Loosely, the term "Internet of Things" or "IoT" may be used by those in the art to refer to uniquely identifiable objects (things) and their virtual representations in a network-based architecture. In particular, the next frontier in the evolution of the Internet is the ability to connect more than just computers and communications devices, but rather the ability to connect "objects" in general, such as lights, appliances, vehicles, HVAC (heating, ventilating, and air-conditioning), windows and window shades and blinds, doors, locks, etc. The "Internet of Things" thus generally refers to the interconnection of objects (e.g., smart objects), such as sensors and actuators, over a computer network (e.g., IP), which may be the Public Internet or a private network. Such devices have been used in the industry for decades, usually in the form of non-IP or proprietary protocols that are connected to IP networks by way of protocol translation gateways. With the emergence of a myriad of applications, such as the smart grid, smart cities, and building and industrial automation, and cars (e.g., that can interconnect millions of objects for sensing things like power quality, tire pressure, and temperature and that can actuate engines and lights), it has been of the utmost importance to extend the IP protocol suite for these networks.

An example protocol specified in an Internet Engineering Task Force (IETF) Proposed Standard, Request for Comment (RFC) 6550, entitled "RPL: IPv6 Routing Protocol for Low Power and Lossy Networks" by Winter, et al. (March 2012), provides a mechanism that supports multipoint-to-point (MP2P) traffic from devices inside the LLN towards a central control point (e.g., LLN Border Routers (LBRs) or "root nodes/devices" generally), as well as point-to-multipoint (P2MP) traffic from the central control point to the devices inside the LLN (and also point-to-point, or "P2P" traffic). RPL (pronounced "ripple") may generally be described as a distance vector routing protocol that builds a Directed Acyclic Graph (DAG) for use in routing traffic/packets 140, in addition to defining a set of features to bound the control traffic, support repair, etc. Notably, as may be appreciated by those skilled in the art, RPL also supports the concept of Multi-Topology-Routing (MTR), whereby multiple DAGs can be built to carry traffic according to individual requirements.

A DAG is a directed graph having the property that all edges (and/or vertices) are oriented in such a way that no cycles (loops) are supposed to exist. All edges are contained in paths oriented toward and terminating at one or more root nodes (e.g., "clusterheads or "sinks"), often to interconnect the devices of the DAG with a larger infrastructure, such as the Internet, a wide area network, or other domain. In addition, a Destination Oriented DAG (DODAG) is a DAG rooted at a single destination, i.e., at a single DAG root with no outgoing edges. A "parent" of a particular node within a DAG is an immediate successor of the particular node on a path towards the DAG root, such that the parent has a lower "rank" than the particular node itself, where the rank of a node identifies the node's position with respect to a DAG root (e.g., the farther away a node is from a root, the higher is the rank of that node). Further, in certain embodiments, a sibling of a node within a DAG may be defined as any neighboring node which is located at the same rank within a DAG. Note that siblings do not necessarily share a common parent, and routes between siblings are generally not part of a DAG since there is no forward progress (their rank is the same). Note also that a tree is a kind of DAG, where each device/node in the DAG generally has one parent or one preferred parent.

DAGs may generally be built (e.g., by a DAG process) based on an Objective Function (OF). The role of the Objective Function is generally to specify rules on how to build the DAG (e.g. number of parents, backup parents, etc.).

In addition, one or more metrics/constraints may be advertised by the routing protocol to optimize the DAG against. Also, the routing protocol allows for including an optional set of constraints to compute a constrained path, such as if a link or a node does not satisfy a required constraint, it is "pruned" from the candidate list when computing the best path. (Alternatively, the constraints and metrics may be separated from the OF.) Additionally, the routing protocol may include a "goal" that defines a host or set of hosts, such as a host serving as a data collection point, or a gateway providing connectivity to an external infrastructure, where a DAG's primary objective is to have the devices within the DAG be able to reach the goal. In the case where a node is unable to comply with an objective function or does not understand or support the advertised metric, it may be configured to join a DAG as a leaf node. As used herein, the various metrics, constraints, policies, etc., are considered "DAG parameters."

Illustratively, example metrics used to select paths (e.g., preferred parents) may comprise cost, delay, latency, bandwidth, expected transmission count (ETX), etc., while example constraints that may be placed on the route selection may comprise various reliability thresholds, restrictions on battery operation, multipath diversity, bandwidth requirements, transmission types (e.g., wired, wireless, etc.). The OF may provide rules defining the load balancing requirements, such as a number of selected parents (e.g., single parent trees or multi-parent DAGs). Notably, an example for how routing metrics and constraints may be obtained may be found in an IETF RFC, entitled "Routing Metrics used for Path Calculation in Low Power and Lossy Networks"<RFC 6551> by Vasseur, et al. (March 2012 version). Further, an example OF (e.g., a default OF) may be found in an IETF RFC, entitled "RPL Objective Function 0"<RFC 6552> by Thubert (March 2012 version) and "The Minimum Rank Objective Function with Hysteresis" <RFC 6719> by O. Gnawali et al. (September 2012 version).

Building a DAG may utilize a discovery mechanism to build a logical representation of the network, and route dissemination to establish state within the network so that routers know how to forward packets toward their ultimate destination. Note that a "router" refers to a device that can forward as well as generate traffic, while a "host" refers to a device that can generate but does not forward traffic. Also, a "leaf" may be used to generally describe a non-router that is connected to a DAG by one or more routers, but cannot itself forward traffic received on the DAG to another router on the DAG. Control messages may be transmitted among the devices within the network for discovery and route dissemination when building a DAG.

According to the illustrative RPL protocol, a DODAG Information Object (DIO) is a type of DAG discovery message that carries information that allows a node to discover a RPL Instance, learn its configuration parameters, select a DODAG parent set, and maintain the upward routing topology. In addition, a Destination Advertisement Object (DAO) is a type of DAG discovery reply message that conveys destination information upwards along the DODAG so that a DODAG root (and other intermediate nodes) can provision downward routes. A DAO message includes prefix information to identify destinations, a capability to record routes in support of source routing, and information to determine the freshness of a particular advertisement. Notably, "upward" or "up" paths are routes that lead in the direction from leaf nodes towards DAG roots, e.g., following the orientation of the edges within the DAG. Conversely, "downward" or "down" paths are routes that lead in the direction from DAG roots towards leaf nodes, e.g., generally going in the opposite direction to the upward messages within the DAG.

Generally, a DAG discovery request (e.g., DIO) message is transmitted from the root device(s) of the DAG downward toward the leaves, informing each successive receiving device how to reach the root device (that is, from where the request is received is generally the direction of the root). Accordingly, a DAG is created in the upward direction toward the root device. The DAG discovery reply (e.g., DAO) may then be returned from the leaves to the root device(s) (unless unnecessary, such as for UP flows only), informing each successive receiving device in the other direction how to reach the leaves for downward routes. Nodes that are capable of maintaining routing state may aggregate routes from DAO messages that they receive before transmitting a DAO message. Nodes that are not capable of maintaining routing state, however, may attach a next-hop parent address. The DAO message is then sent directly to the DODAG root that can in turn build the topology and locally compute downward routes to all nodes in the DODAG. Such nodes are then reachable using source routing techniques over regions of the DAG that are incapable of storing downward routing state. In addition, RPL also specifies a message called the DIS (DODAG Information Solicitation) message that is sent under specific circumstances so as to discover DAG neighbors and join a DAG or restore connectivity.

Figure 3:
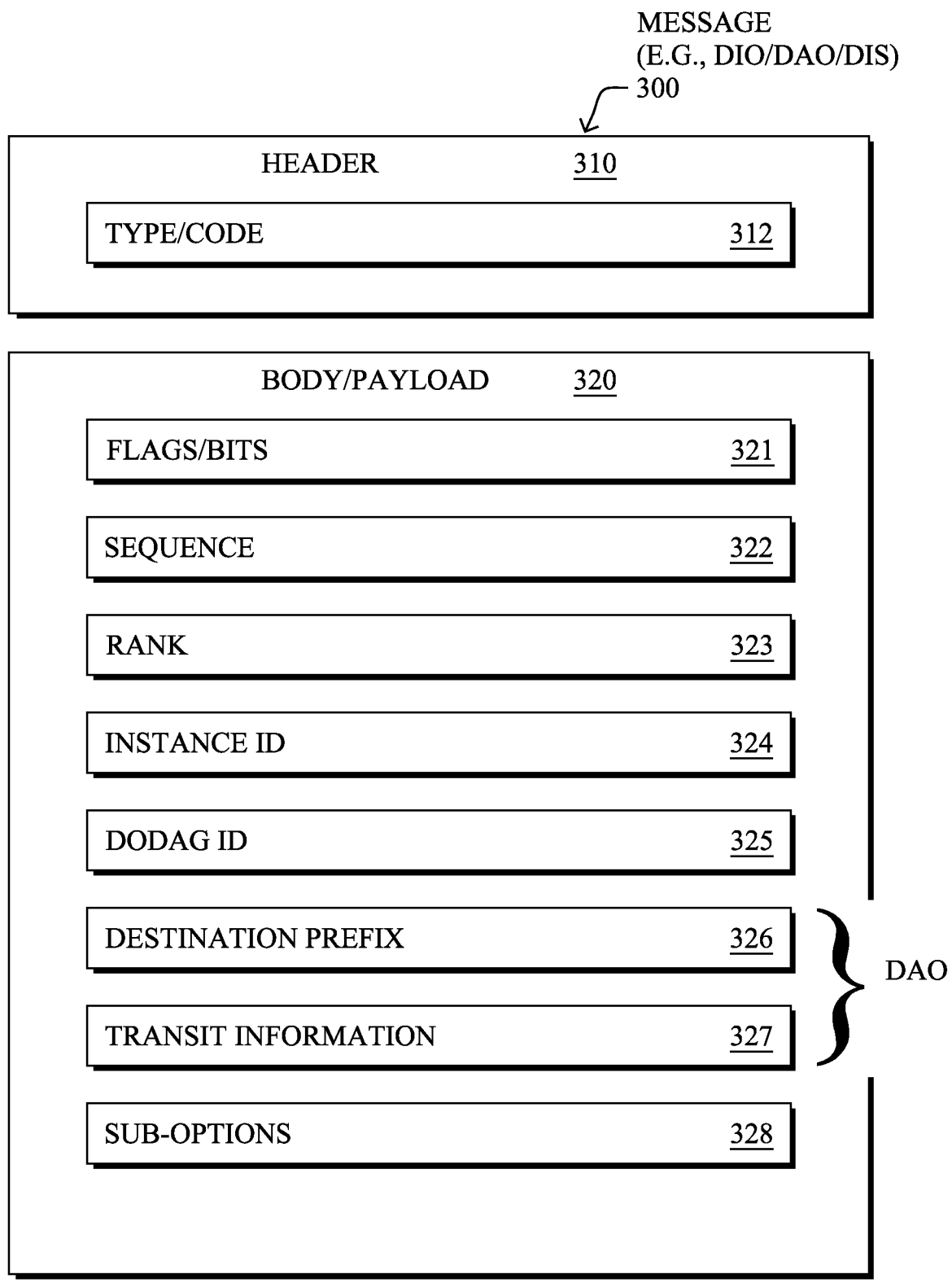
FIG. 3 illustrates an example routing protocol message format.

FIG. 3 illustrates an example simplified control message format 300 that may be used for discovery and route dissemination when building a DAG, e.g., as a DIO, DAO, or DIS message. Message 300 illustratively comprises a header 310 with one or more fields 312 that identify the type of message (e.g., a RPL control message), and a specific code indicating the specific type of message, e.g., a DIO, DAO, or DIS. Within the body/payload 320 of the message may be a plurality of fields used to relay the pertinent information. In particular, the fields may comprise various flags/bits 321, a sequence number 322, a rank value 323, an instance ID 324, a DODAG ID 325, and other fields, each as may be appreciated in more detail by those skilled in the art. Further, for DAO messages, additional fields for destination prefixes 326 and a transit information field 327 may also be included, among others (e.g., DAO_Sequence used for ACKs, etc.). For any type of message 300, one or more additional sub-option fields 328 may be used to supply additional or custom information within the message 300. For instance, an objective code point (OCP) sub-option field may be used within a DIO to carry codes specifying a particular objective function (OF) to be used for building the associated DAG. Alternatively, sub-option fields 328 may be used to carry other certain information within a message 300, such as indications, requests, capabilities, lists, notifications, etc., as may be described herein, e.g., in one or more type-length-value (TLV) fields.

Figure 4:
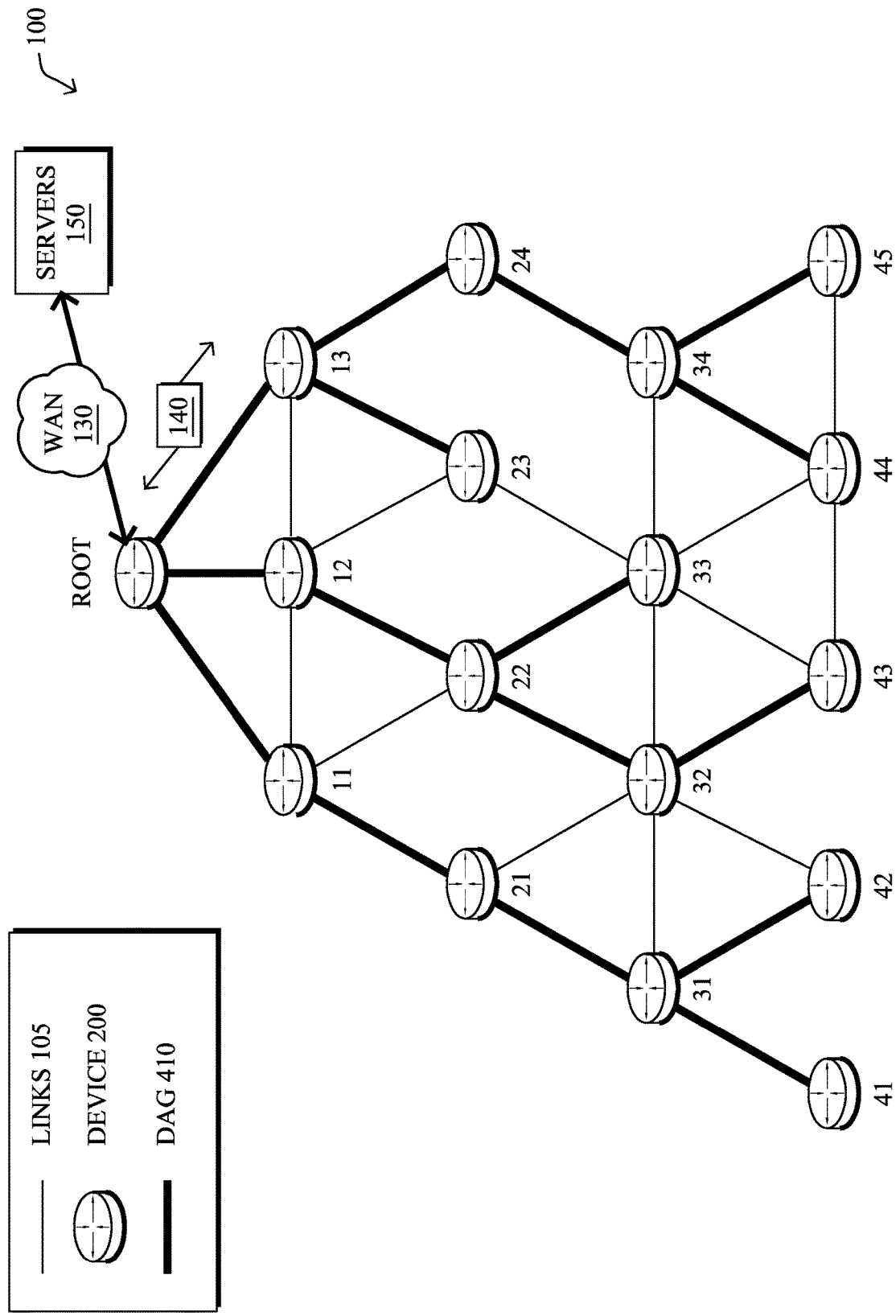
FIG. 4 illustrates an example directed acyclic graph (DAG) in the network.

FIG. 4 illustrates an example simplified DAG that may be created, e.g., through the techniques described above, within network 100 of FIG. 1. For instance, certain links 105 may be selected for each node to communicate with a particular parent (and thus, in the reverse, to communicate with a child, if one exists). These selected links form the DAG 410 (shown as bolded lines), which extends from the root node toward one or more leaf nodes (nodes without children). Traffic/packets 140, shown previously in FIG. 1, may then traverse the DAG 410 in either the upward direction toward the root or downward toward the leaf nodes, particularly as described herein.

As noted above, low-cost wireless mesh network devices such as smart meters, street light controllers, and other sensors or actuators typically use low-cost crystal oscillators (XO) as radio frequency (RF) references. Unfortunately, though, low-cost crystal oscillators also exhibit a large frequency drift over device characteristics such as temperature, unit-to-unit variation, aging (e.g., over a 10-15 year lifespan), and/or supply voltage. Variation in the supply voltage is particularly problematic for battery-powered devices because the supply voltage decreases as the battery drains.

A large frequency error can degrade the performance in a wireless network. This is especially true in narrow-band, low data rate cases where the drift in the radio frequency of the wireless transceiver due to the frequency error of the crystal may be a large fraction of the channel bandwidth. Indeed, the channel filter of a receiver needs to be widened to accommodate the maximum possible frequency offset. Doing so, though, can significantly reduce performance, particularly in the case of narrow-band deployments.

Figure 5A:
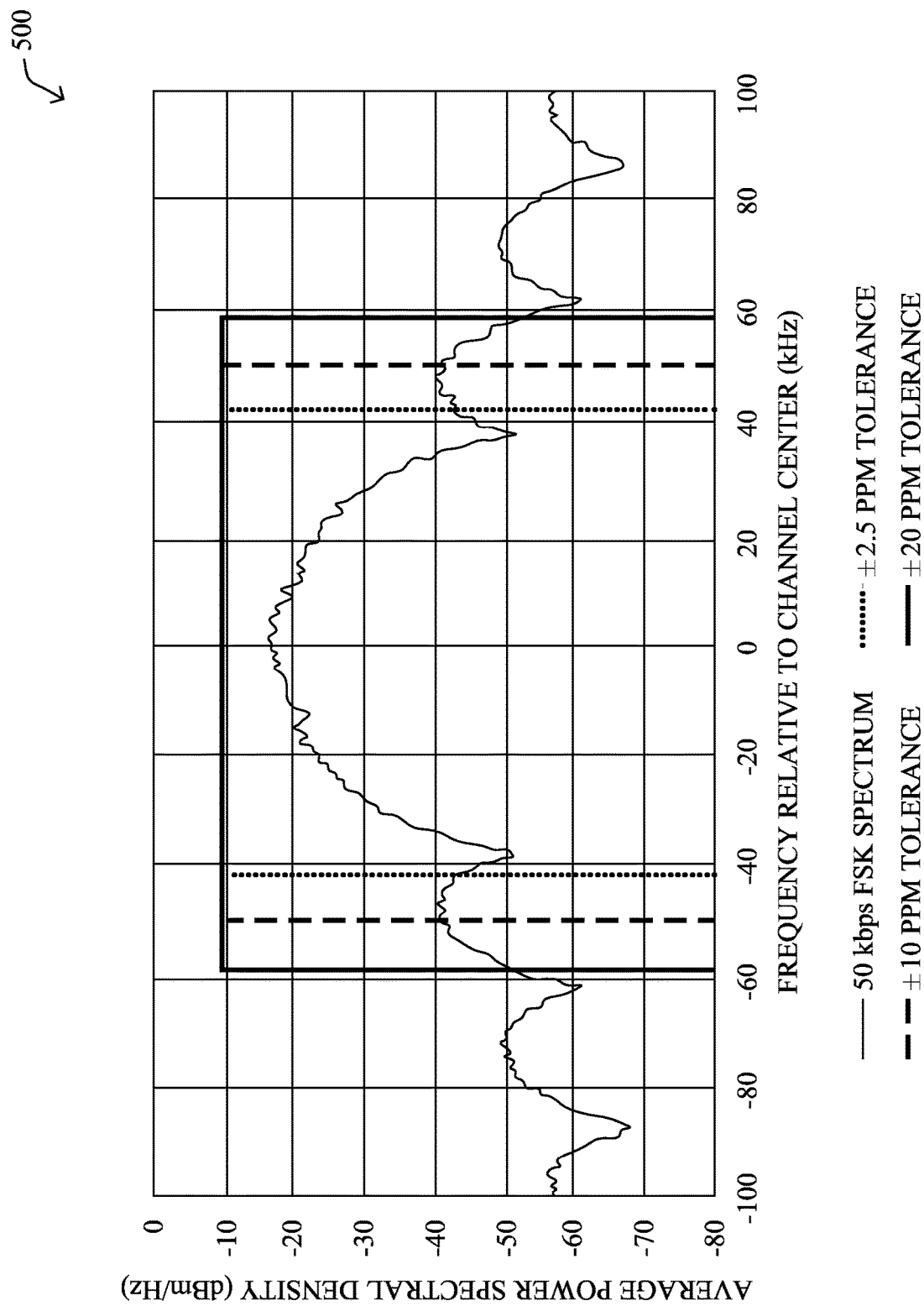
FIGS. 5A-5B illustrate example plots of the variation of frequency with device characteristics.

FIG. 5A illustrates an example plot 500 showing a comparison of the receiver channel filter equivalent noise bandwidth for a measured 802.15.4 g 50 kbps frequency-shift keying (FSK) signal at 866 MHz. In the example shown, the channel filter has an 83.4 kHz equivalent noise bandwidth in a system wherein all devices are equipped with a temperature compensated crystal oscillator (TCXO) with a maximum frequency error of +/−2.5 parts per million (ppm) as their radio frequency reference. To tolerate a maximum frequency drift of +/−20 ppm, which may be typical of crystal oscillators without compensation, the channel filter must be widened to 118 kHz, which corresponds to an increase in the noise floor of 1.5 decibels (dB) and a corresponding decrease in the sensitivity of the receiver.

If the local oscillator (LO) frequency of the transmitter is offset from the center of the channel in which it is supposed to operate, more power falls outside of the operating channel, which can cause interference to other systems. It also makes it more difficult to satisfy regulatory spectral emissions limits without reducing the transmit power or by increasing the guard band between channels and at the band edge, which reduces range and spectral efficiency.

Figure 5B:
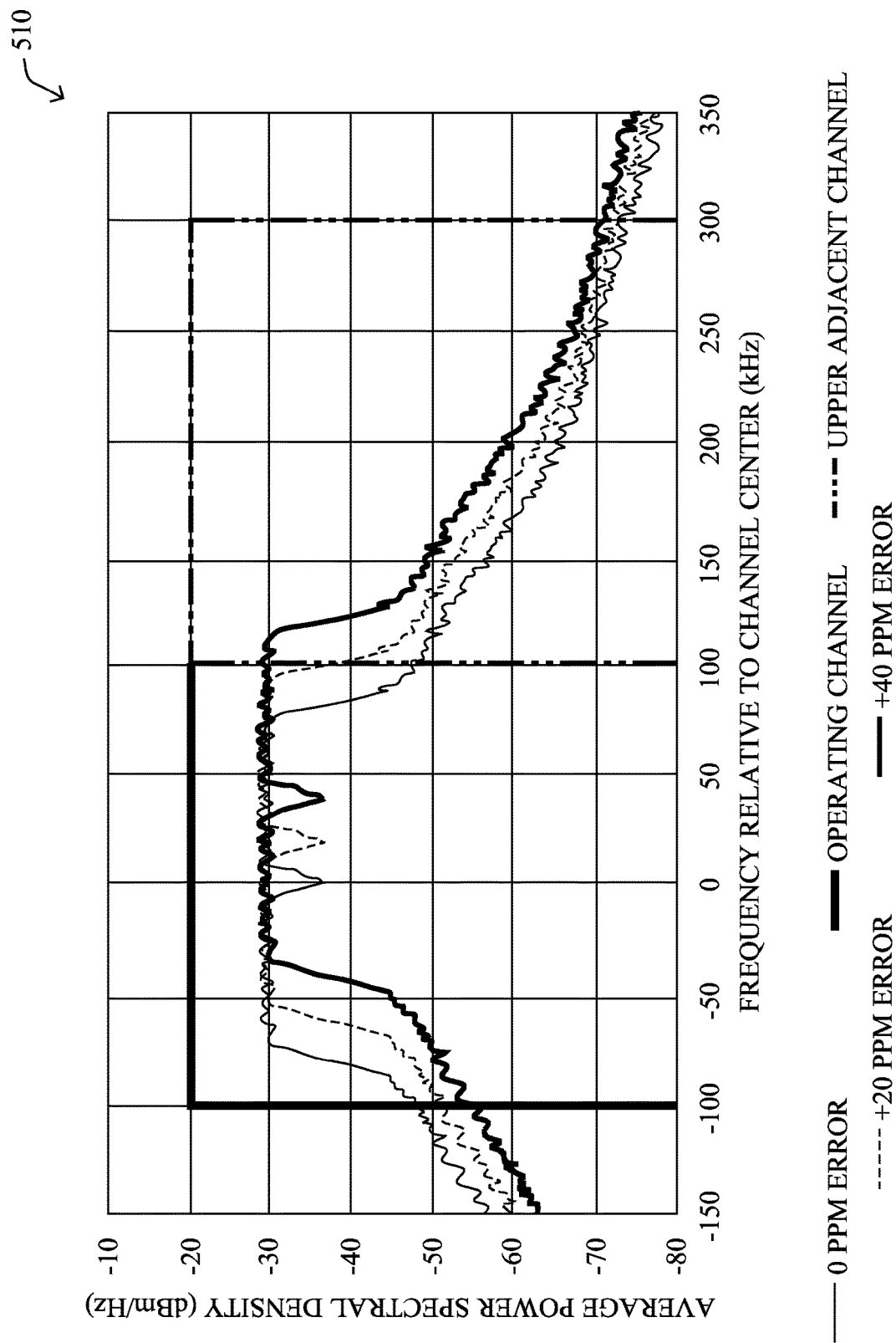

FIG. 5B illustrates an example plot 510 showing power emitted in an adjacent channel in terms of power spectral density. More specifically, plot 510 plots the average power spectral density (dBm/Hz) as a function of frequency offset relative to channel center (kHz) for an 802.15.4 g orthogonally frequency-division multiplexing (OFDM). From plot 510, it can be seen that the total adjacent channel power (ACP) of the transmitter is as follows:
- −25.9 decibels relative to carrier (dBc) if the transmitter is centered within its channel
- −22.7 dBc with 20 ppm error
- −11.2 dBc with 40 ppm error Thus, if two nearby nodes/devices are offset by +20 and −20 ppm from the ideal channel center frequency, resulting in a relative offset of 40 ppm between devices; the level of ACI experienced by one device receiving while the other is transmitting on an adjacent channel is nearly 15 dB higher than if the operating frequencies of both devices were centered within their respective channel. The receiving device would need a signal-to-noise-plus-interference ratio (SINR) nearly 15 dB better to experience the same level of ACI and, therefore, operate at the same data rate, than if both devices were both centered within the channel.

Radio Frequency Synchronization in Low-Power and Lossy Networks

The techniques herein introduce an RF synchronization scheme that addresses the frequency error found in many LLN devices. In some aspects, a device using the techniques herein leverages both a temperature measurement-based frequency adjustment, as well as a frequency adjustment based on a packet received from a neighboring device, such as its DAG parent in the LLN.

Specifically, according to one or more embodiments of the disclosure as described in detail below, a device in a low-power and lossy network (LLN) makes, based on a temperature measurement, a first adjustment to a frequency for a wireless channel used by the device to communicate with one or more neighboring devices in the LLN. The device receives, via the wireless channel, a packet from one of the neighboring devices that indicates a transmit frequency for the packet. The device calculates a frequency offset based on a difference between the transmit frequency for the packet and the adjusted frequency for the wireless channel. The device makes, based on the calculated frequency offset, a second adjustment to the frequency for the wireless channel used by the device to communicate with the one or more neighboring devices in the LLN.

Illustratively, the techniques described herein may be performed by hardware, software, and/or firmware, such as in accordance with the network formation process 248, which may include computer executable instructions executed by the processor 220 (or independent processor of interfaces 210) to perform functions relating to the techniques described herein, e.g., in conjunction with routing process 244.

Figure 6:
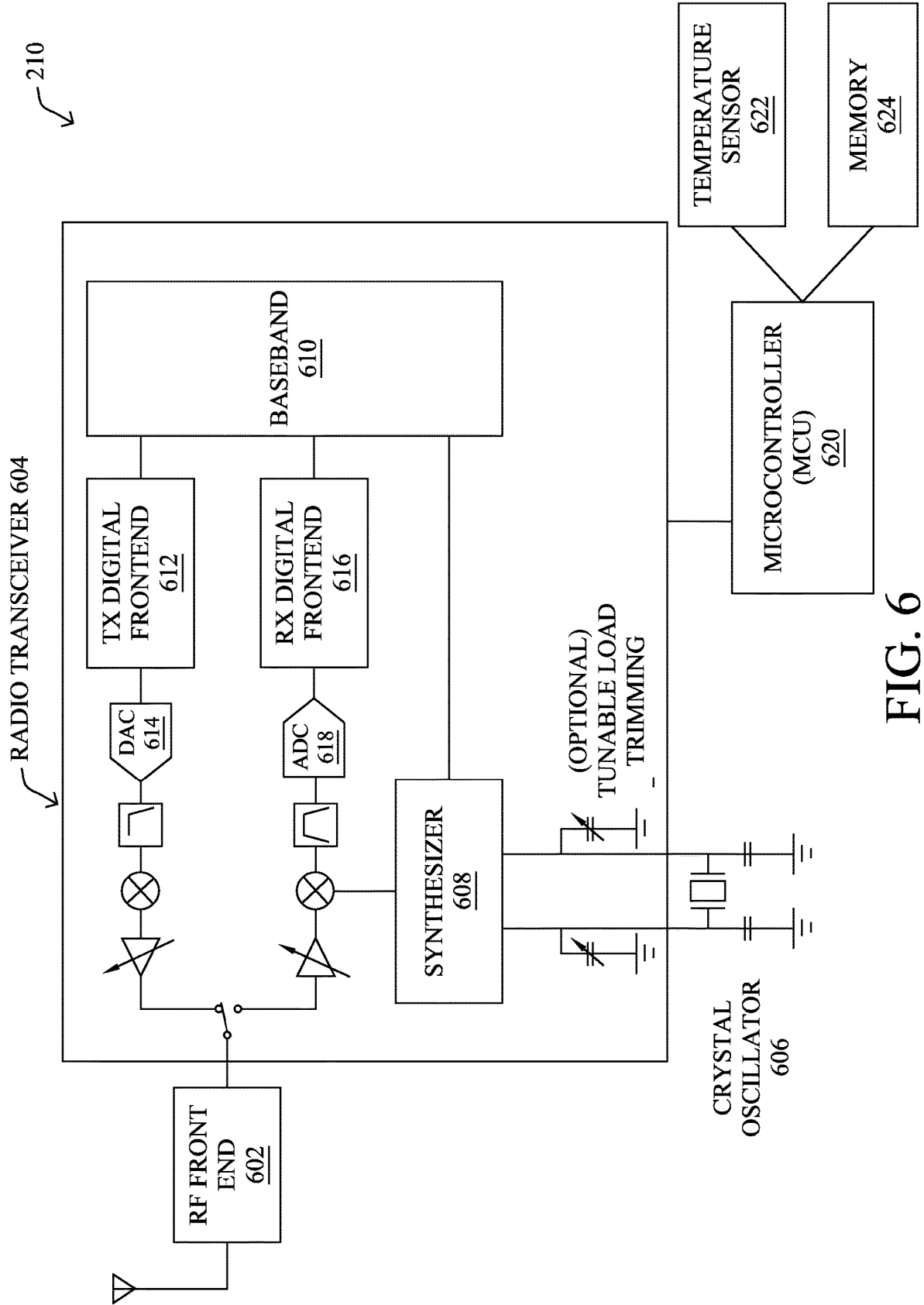
FIG. 6 illustrates an example of a network interface.

Operationally, FIG. 6 illustrates an example of network interface 210 configured to communicate with a wireless network, such as an LLN. As shown, network interface may generally include an RF front end 602 coupled to radio transceiver 604, which is controlled by a microcontroller (MCU) 620 with integrated memory 624. In some embodiments, MCU 620 may also be coupled to a temperature sensor 622 configured to take temperature measurements One skilled in the art would appreciate that the components of network interface 210 are shown in a simplified manner for illustrative purposes and can be implemented in any number of ways. In addition, the components shown can also be combined, relocated, or omitted, as desired.

Radio transceiver 604 may generally include a crystal oscillator 606 that provides a frequency reference to synthesizer 608 of radio transceiver 604. In general, synthesizer 608 is configured to generate a plurality of different frequencies from a single reference frequency provided by crystal oscillator 606. For example, synthesizer 608 may employ a technique such as a phase-locked loop (PLL) or another suitable approach. The resulting signal is then mixed with a baseband signal from baseband generator 610.

When transmitting, a transmit (Tx) digital frontend 612 may operate in conjunction with a digital to analog converter (DAC) 614 to transmit a signal via RF frontend 602. Similarly, when receiving, a receive (Rx) channel filter 626 and an analog to digital converter (ADC) 618 may operate in conjunction with an Rx digital frontend 616, to detect and process the signal received via RF front end 602.

FIGS. 7A-7D illustrate an example of frequency synchronization in network 100, according to various embodiments.

Figure 7A:
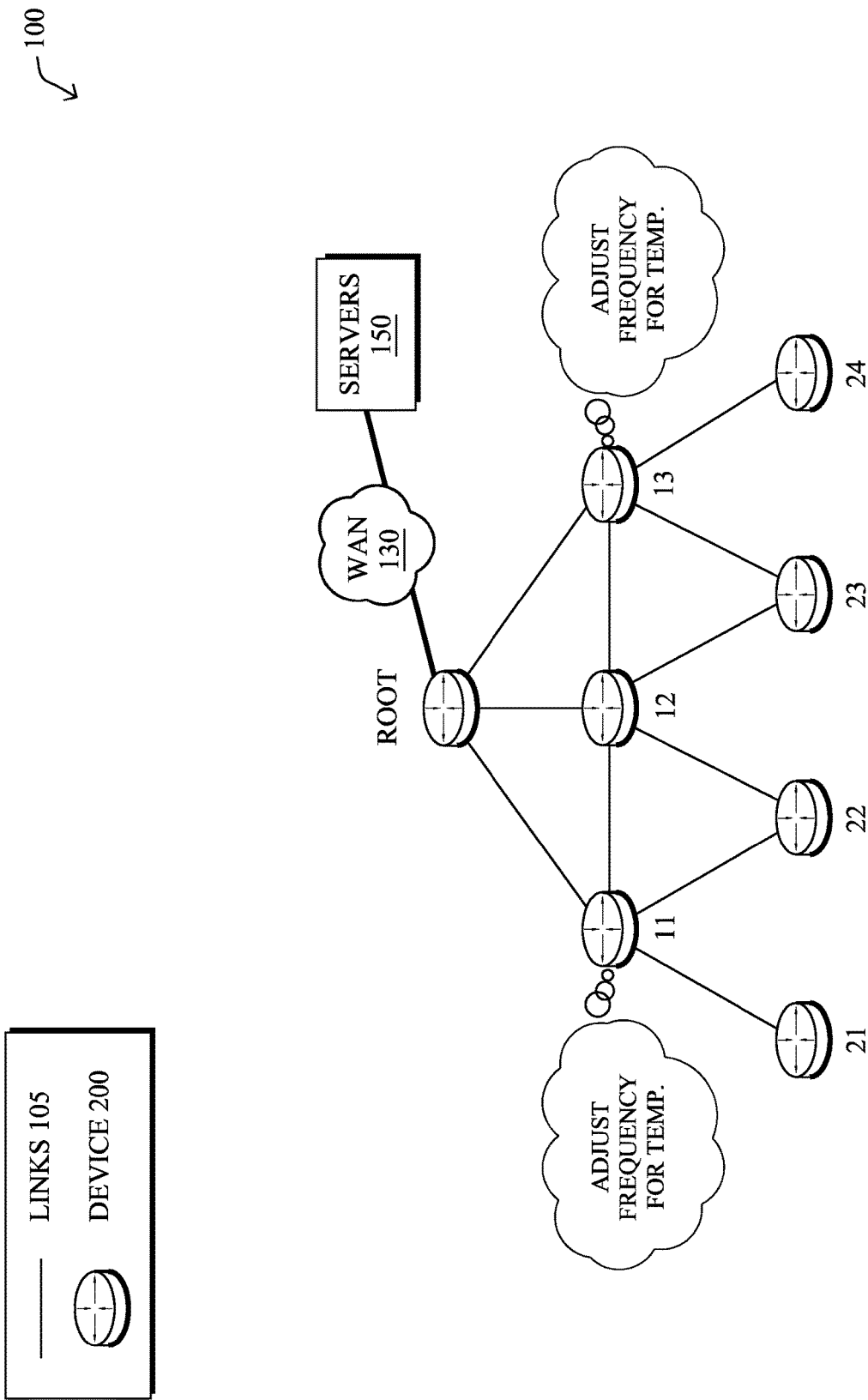
FIGS. 7A-7D illustrate an example of frequency synchronization in a network.

As shown in FIG. 7A, consider a simplified portion of network 100 that includes a Root node and nodes 11-13 and 21-24.

According to various embodiments, frequency synchronization across the nodes/devices 200 of network 100 may be achieved in two steps. In a first step, each node/device 200 in network 100 may make a first adjustment to a frequency for a wireless channel used by the device to communicate with one or more of its neighboring devices in the LLN. More specifically, each node/device 200 may adjust its frequency, to cancel out most of the frequency drift of its oscillator due to temperature.

Referring again briefly to FIG. 5, the first frequency adjustment made by a device 200 may be computed and implemented by its MCU 620 using a set of compensation coefficients preprogrammed into its memory and based on a temperature reading. Optionally, the frequency can be measured at a nominal temperature during the manufacturing test process and a calibration programmed into the memory of MCU 620 to account for the initial unit-to-unit variation of crystal oscillator 606.

Preferably, the temperature reading on which MCU 620 bases its frequency adjustment is made by a local temperature sensor, such as temperature sensor 622, as doing so will most closely reflect the temperature of crystal oscillator 606. However, in a further embodiment, MCU 620 may receive the temperature measurement from a nearby or neighboring device in the same environment.

Typically, the frequency drift of crystal oscillator 606 as a function of temperature will take the form of a cubic polynomial on which the compensation coefficients of MCU 620 may be based. In turn, MCU 620 may periodically use its compensation coefficients with the latest temperature measurement, to determine a frequency offset for crystal oscillator 606.

According to various embodiments, MCU 620 may adjust the frequency of crystal oscillator 606 in a number of different ways. In one embodiment, MCU 620 may do so by adjusting the load capacitance of crystal oscillator 606 using a process sometimes referred to as 'trimming.' In another embodiment, MCU 620 may adjust the output of synthesizer 608 according to its computed adjustment.

Referring again to FIG. 7A, the goal of the initial frequency adjustment is to ensure that a previously unsynchronized node's frequency is not so far off that it cannot even receive packets from its neighbors without widening its channel filter (e.g., filter 626 in FIG. 6). Notably, the node needs to be able to receive control traffic at a base data rate, so that it can even join network 100.

For example, assume that node 11 has a measured temperature of $T_{11}$ and the target center frequency for a particular channel is $f_0$. Based on the measured temperature, node 11 may compute and apply a first frequency adjustment as a frequency offset of $\Delta f_{111}$, leading to an adjusted synthesizer channel frequency of $f_{111}=f_0+\Delta f_{111}$.

Similarly, assume that node 13 has a measured temperature of $T_{13}$ and also has a target frequency for the channel of $f_0$. In this case, node 13 may compute and apply a first frequency adjustment as a $\Delta f_{131}$ offset, leading to an adjusted synthesizer frequency of $f_{131}=f_0+\Delta f_{131}$ for the channel.

Figure 7B:
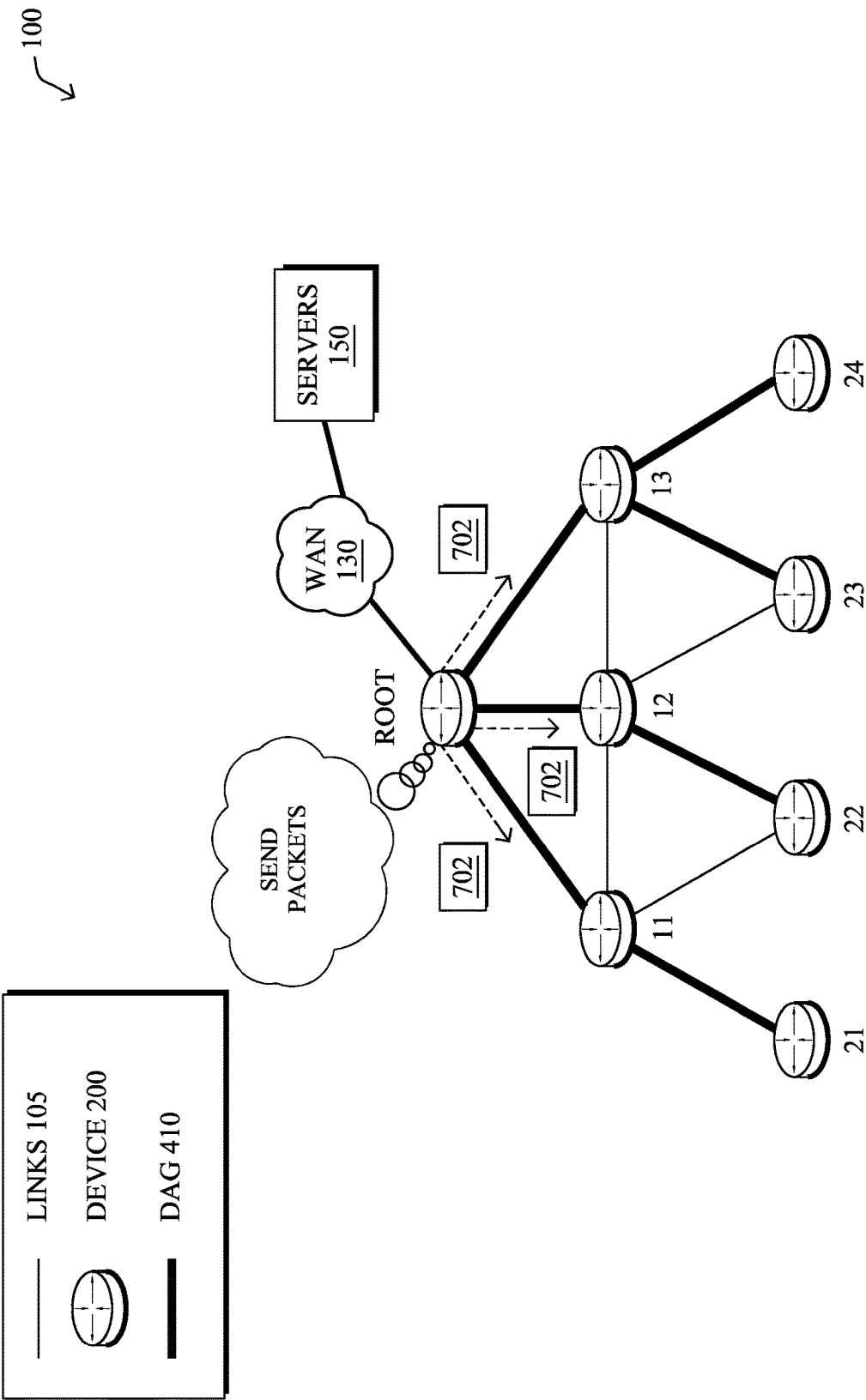

Any or all of the nodes/devices 200 in network 100 may perform similar adjustments to their channel frequencies, based on their temperature measurements. In turn, as shown in FIG. 7B, the devices 200 may join network 100 and organize themselves according to the routing protocol in use, such as RPL. For example, as described previously, nodes 200 may form a DAG 410 whereby each link 105 in DAG 410 establishes a parent-child relationship between its corresponding nodes/devices 200. For instance, nodes 11-13 may each be child nodes of the Root node of DAG 410. Similarly, node 21 may be a child of node 11, node 22 may be a child of node 12, and nodes 23-24 may be children of node 13.

While the temperature-based frequency adjustments made by nodes/devices 200 may be suitable to facilitate communications between them, there may be still some degree of frequency error due to any remaining thermal offset, aging, unit-to-unit variations, supply voltage variations, etc. Accordingly, a subsequent frequency adjustment is also introduced herein that is based on one or more packets received from the parent of the node/device 200.

As shown in FIG. 7B, the Root may send packets 702 to its children (e.g., nodes 11-13) indicative of the transmit frequency of the packet 702. Generally speaking, the Root node of an LLN is expected to be of higher capabilities than the other nodes/devices in the network. As such, the crystal oscillator of the Root is expected to have significantly less frequency drift than that of the other nodes 11-24 and packets 702 can serve as a reference for the children of the Root.

Figure 7C:
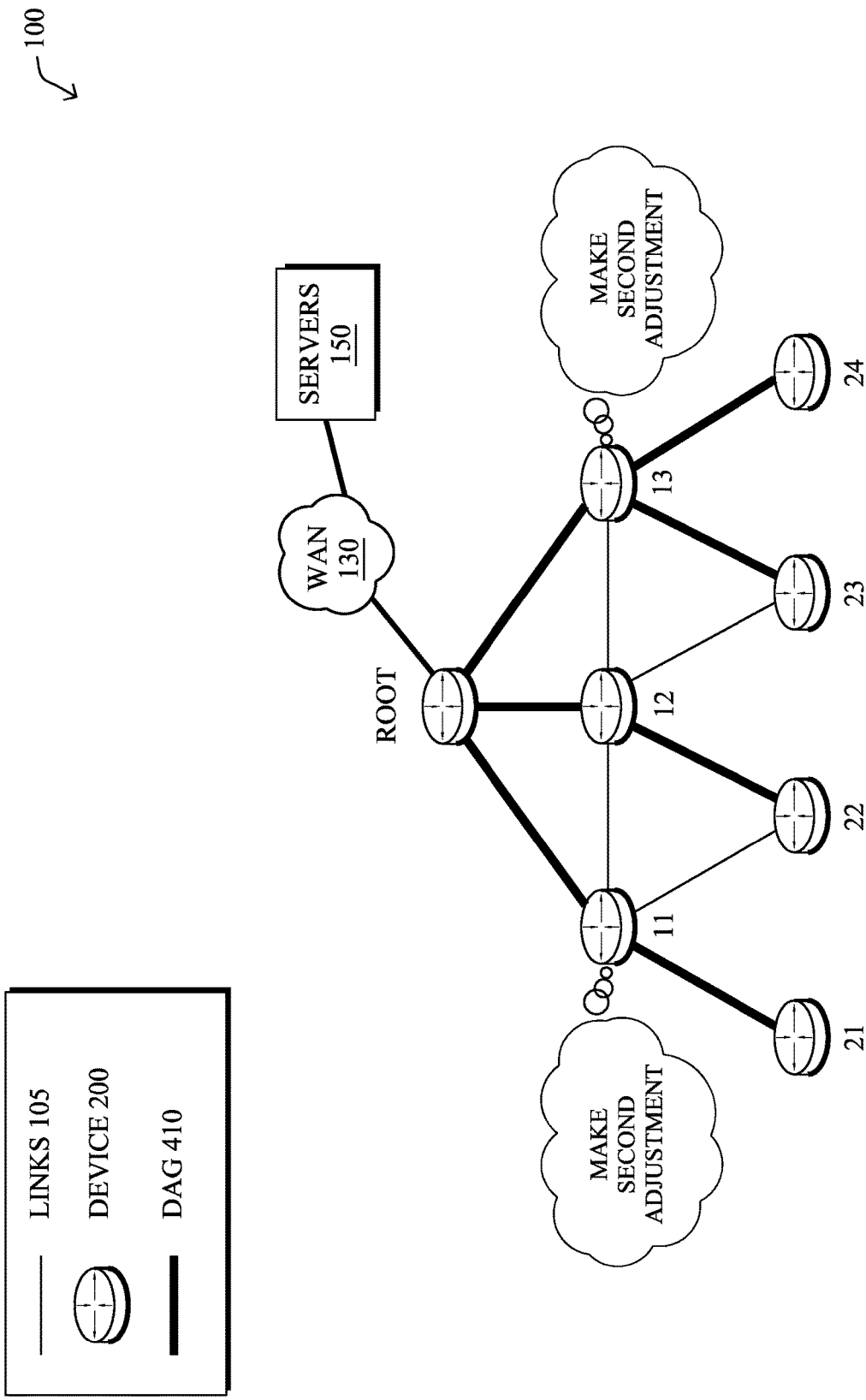

In FIG. 7C, each node receiving a packet 702 from the Root node may compute an estimate of the frequency error based on the preamble information of packets 702. There are a variety of ways the frequency error can be calculated from a received packet, but it is often done in the baseband by estimating the phase error of the down converted radio frequency signal relative to the transceiver's phase locked loop. Many commercial transceivers either provide these phase error values or directly provide an estimate of the frequency error to higher level software.

In various embodiments, the receiving nodes may make a second frequency adjustment to their channel frequencies based on the frequency errors computed from the preamble information of packets 702. More specifically, each receiving node, such as nodes 11-13 may use the frequency errors as a further frequency offset, to cancel out any remaining frequency drift after the temperature-based adjustment (e.g., due to aging, supply voltage variations, etc.).

Continuing the prior examples, assume that node 11 has configured its synthesizer to a target frequency of $f_{111}$ to cancel out its crystal oscillator's thermal variation in order to approach the ideal channel center frequency $f_0$. Assume also that the Root transmits packets 702 to its children on the channel at a frequency of $f_{root}$ and that node 11 receives a packet at frequency $f_{root11}$. In such a case, node 11 may calculate a frequency offset based on the difference between the received frequency of packet 702 and its current channel frequency value. If the root and all nodes are stationary, as is the case in many wireless field area networks, then there is no Doppler shift so the transmitted and received frequencies of the packets are the same, that is $f_{root11} = f_{root}$. Here, node 11 may calculate a second frequency offset of $\Delta f_{112} = f_{root11} - f_{111}$. In various embodiments, node 11 may then apply a second adjustment to its frequency based on this offset, resulting in a final synthesizer frequency of $f_{112} = f_0 + \Delta f_{111}$ (temperature-based adjustment)$+ \Delta f_{112}$ (packet-based adjustment)$= f_{root11}$. Thus, after the second frequency adjustment, the frequency that node 11 may program in its memory for the channel equals the frequency of the packet received from the Root.

Similarly, assume that node 13 receives a packet 702 at frequency $f_{root13}$ after adjusting its channel frequency to account for temperature to be $f_{131}$. In such a case, node 13 may compute a frequency offset from that of the Root of $\Delta f_{132} = f_{root13} - f_{131}$. Applying this second frequency adjustment to its channel frequency results in a final offset of $\Delta f_{13} = \Delta f_{131} + \Delta f_{132}$ and a finalized channel frequency of $f_{132} = f_0 + \Delta f_{13} = f_{root13}$.

Figure 7D:
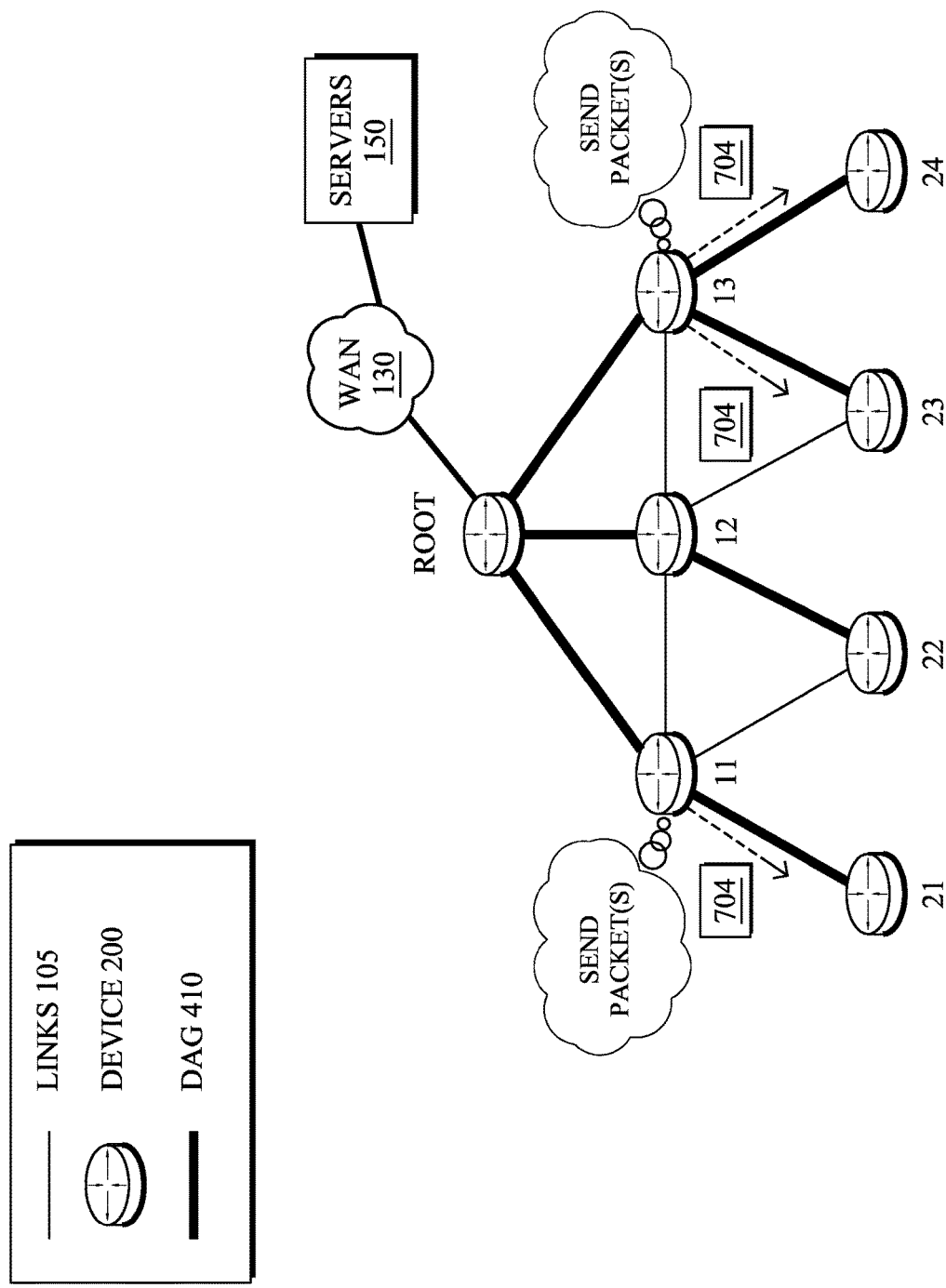

As shown in FIG. 7D, after making their respective second frequency adjustments, the children nodes of the Root may send out their own packets 704 to their own children, according to DAG 410. For example, node 11 may send packet 704 to its child node 21 and node 13 may send packets 704 to its children, nodes 23-24. Each receiving node will then perform its own second frequency adjustment, based on the preambles of packets 704.

The above process of receiving a packet via a certain channel, making a second frequency adjustment for the channel based on the packet, and then transmitting a packet via the channel may be repeated any number of times until the nodes of network 100 have all been synchronized. As all of these nodes ultimately report to the Root, they will all become synchronized to that of the Root. Further, as the mesh topology of network 100 changes, each device 200 will remember its previous frequency correction and will continue calculating correction updates based on the signals that it receives from its new parent.

In various embodiments, if frequency/channel hopping is used in network 100, the devices 200 may also apply any channel offsets learned from packets 702 to their subsequent channels in their schedules, as well. For example, the frequency offset applied by node 13, MB, may be scaled to give the same relative offset at any or all of the channels in its hopping schedule, such as by applying a frequency offset of $\Delta f_{13} * (f_n/f_0)$, where $f_n$ is the center frequency of the nth channel in the hopping schedule.

While the frequency synchronization mechanism introduced herein is intended to be used with frequency hopping radios, the techniques herein are not limited as such. Note also that, in a frequency hopping system, the frequency correction must be calculated as a relative value (e.g., in ppm), rather than an absolute value (e.g., in Hz). The relative frequency error does not depend on operating frequency, so an offset calculated on one channel can be used on any other channel. In a further embodiment, a node/device can also aggregate multiple samples to improve its frequency correction, as it receives more packets from its parent. For example, a node/device 200 may apply an exponentially weighted moving average to its set of calculated frequency offsets, which will both smooth out noise and weight more recent samples more strongly.

Figure 8:
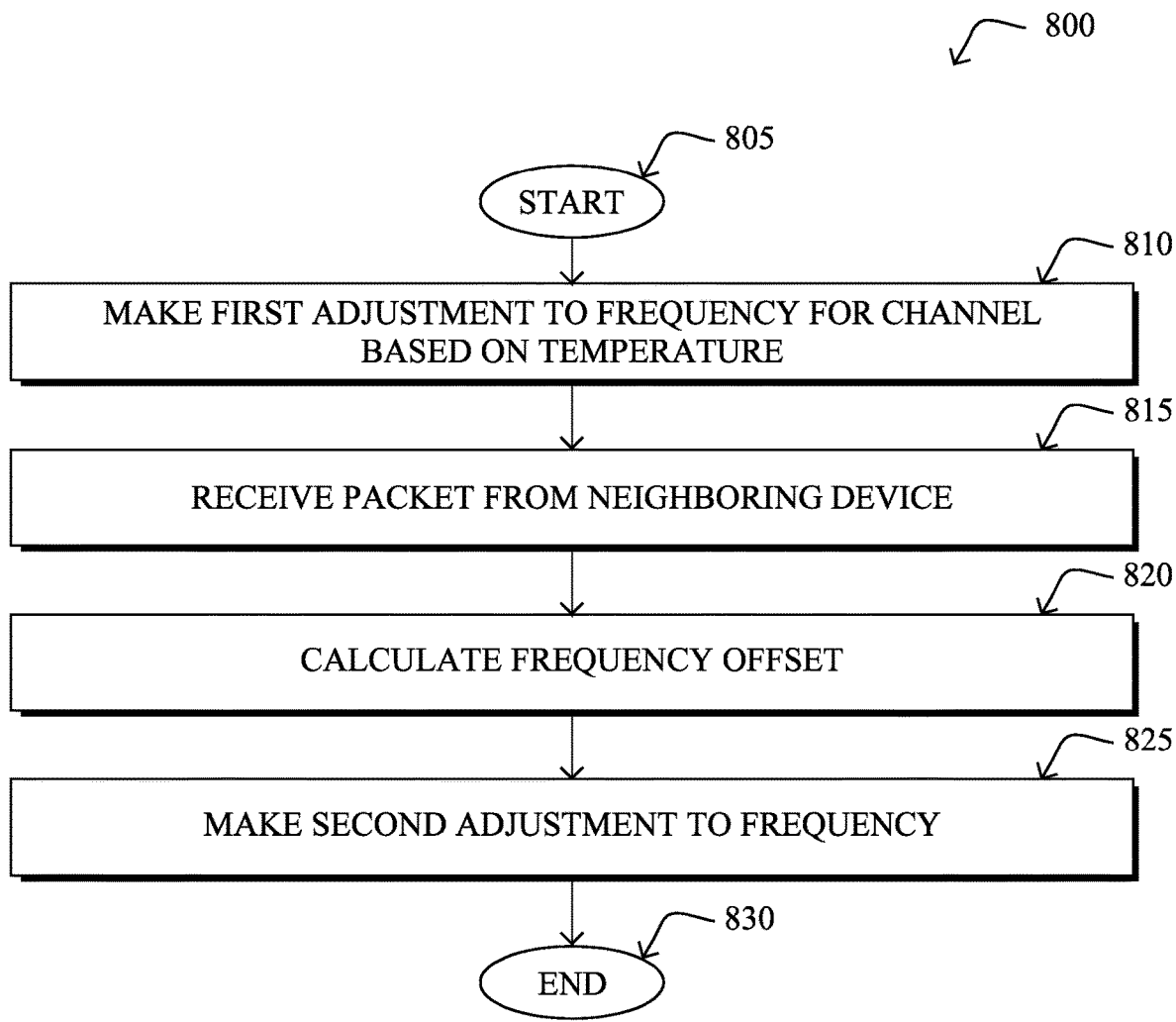
FIG. 8 illustrates an example simplified procedure for synchronizing a channel frequency.

FIG. 8 illustrates an example simplified procedure for synchronizing a channel frequency I in a network, in accordance with one or more embodiments described herein. For example, a non-generic, specifically configured node/device (e.g., device 200) in a mesh network (e.g., an LLN) may perform procedure 800 by executing stored instructions (e.g., processes 244, 248). The procedure 800 may start at step 805, and continues to step 810, where, as described in greater detail above, the device may make, based on a temperature measurement, a first adjustment to a frequency for a wireless channel used by the device to communicate with one or more neighboring devices in the LLN.

More specifically, the device may apply a frequency offset to its channel frequency according to pre-stored compensation coefficients as a function of the measured temperature. Typically, these coefficients will be based on a cubic polynomial function that relates the frequency error for the crystal oscillator of the device to temperature. Preferably, the device may comprise a temperature sensor to take the temperature measurement, although the device may also receive such a measurement from a neighboring device, as well. In various embodiments, the device may make the first adjustment by adjusting a load capacitance of its crystal oscillator or by adjusting an output of its synthesizer, according to the frequency offset calculated based on the measured temperature.

At step 815, as detailed above, the device may receive a packet from one of its neighboring devices that indicates a transmit frequency for the packet. Notably, the transmit frequency may be indicated by the channel used to convey the packet, as well as information stored in the preamble of the packet itself.

At step 820, the device may calculate a frequency offset based on a difference between the transmit frequency for the packet and the adjusted frequency for the wireless channel, as described in greater detail above. In various embodiments, the device may do so under the assumption that the sender of the packet is already using a corrected frequency for the channel. In turn, the device may determine any differences between the sending frequency of the packet and its own frequency for the channel that was previously adjusted based on the temperature.

At step 825, as detailed above, the device may make, based on the calculated frequency offset, a second adjustment to the frequency for the wireless channel used by the device to communicate with the one or more neighboring devices in the LLN.

Consequently, the device has not only adjusted its frequency to account for any temperature-attributable frequency errors, but also for any frequency error due to residual temperature, voltage variations, aging, etc. In various embodiments, if the device itself has any children in the network, the device may also send its own packet to them, so that the process repeats itself throughout the network. Procedure 800 then ends at step 830.

It should be noted that while certain steps within procedure 800 may be optional as described above, the steps shown in FIG. 8 are merely examples for illustration, and certain other steps may be included or excluded as desired. Further, while a particular order of the steps is shown, this ordering is merely illustrative, and any suitable arrangement of the steps may be utilized without departing from the scope of the embodiments herein.

The techniques described herein, therefore, allow devices in an LLN to synchronize their channel frequencies in a manner that accounts for variations in their temperatures, supply voltages, aging, and other factors that can lead to frequency drift. In some aspects, the techniques herein can also be applied to existing devices, without requiring any hardware changes to those devices, and in a computationally inexpensive manner.

While there have been shown and described illustrative embodiments that provide for frequency synchronization in LLNs and other forms of networks, it is to be understood that various other adaptations and modifications may be made within the spirit and scope of the embodiments herein. In addition, while certain protocols are shown, such as RPL, other suitable protocols may be used, accordingly.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly, this description to be taken only by way of example and not to otherwise limit the scope of the embodiments herein. Therefore, it is the object of the appended claims to cover all such variations and modifications as come within the true spirit and scope of the embodiments herein.

What is claimed is:

1. A method comprising:
   making, by a device in a low-power and lossy network (LLN) and based on a temperature measurement, a first adjustment to a frequency for a wireless channel used by the device to communicate with one or more neighboring devices in the LLN, wherein routing in the network is performed using a directed acyclic graph (DAG);
   receiving, at the device and via the wireless channel, a first packet from a root node of the DAG, wherein the first packet indicates a transmit frequency for the first packet;
   after making the first adjustment to the frequency for the wireless channel based on the temperature measurement:
      calculating, by the device, a frequency offset based on a difference between the transmit frequency for the first packet received from the root node and the adjusted frequency for the wireless channel, and
      making, by the device and based on the calculated frequency offset, a second adjustment to the frequency for the wireless channel used by the device to communicate with the one or more neighboring devices in the LLN; and
   after making the second adjustment to the frequency for the wireless channel based on the calculated frequency offset:
      sending, by the device, a second packet to a child node of the device according to the DAG, wherein the second packet indicates a transmit frequency for the second packet to enable the child node to make the same second adjustment to a frequency for the wireless channel used by the child node.

2. The method as in claim 1, further comprising:
   taking, by the device, the temperature measurement using a temperature sensor that is local to the device.

3. The method as in claim 1, wherein making the first adjustment to the frequency for the wireless channel comprises:
   adjusting a load capacitance of a crystal oscillator of the device.

4. The method as in claim 1, wherein making the first adjustment to the frequency for the wireless channel comprises:
   adjusting a frequency output of a synthesizer of the device.

5. The method as in claim 1, further comprising:
   making, by the device, the same first and second adjustments to a frequency for a second wireless channel used by the device to communicate with the one or more neighboring devices in the LLN.

6. The method as in claim 5, wherein the wireless channel precedes the second wireless channel in a channel hopping schedule of the device.

7. The method as in claim 1, wherein the device makes the first adjustment to the frequency based on a cubic polynomial that relates frequency error to temperature.

8. An apparatus, comprising:
one or more network interfaces to communicate with low-power and lossy network (LLN);
a processor coupled to the network interfaces and configured to execute one or more processes; and
a memory configured to store a process executable by the processor, the process when executed operable to:
   make, based on a temperature measurement, a first adjustment to a frequency for a wireless channel used by the apparatus to communicate with one or more neighboring devices in the LLN, wherein routing in the network is performed using a directed acyclic graph (DAG);
   receive, via the wireless channel, a first packet from a root node of the DAG, wherein the first packet indicates a transmit frequency for the first packet;
   after making the first adjustment to the frequency for the wireless channel based on the temperature measurement:
      calculate a frequency offset based on a difference between the transmit frequency for the first packet received from the root node and the adjusted frequency for the wireless channel, and
      make, based on the calculated frequency offset, a second adjustment to the frequency for the wireless channel used by the apparatus to communicate with the one or more neighboring devices in the LLN; and
   after making the second adjustment to the frequency for the wireless channel based on the calculated frequency offset:
      send a second packet to a child node of the device according to the DAG, wherein the second packet indicates a transmit frequency for the second packet to enable the child node to make the same second adjustment to a frequency for the wireless channel used by the child node.

9. The apparatus as in claim 8, wherein the apparatus further comprises a temperature sensor, and wherein the process when executed is further configured to:
   take the temperature measurement using the temperature sensor.

10. The apparatus as in claim 8, wherein the apparatus further comprises a crystal oscillator, and wherein the apparatus makes the first adjustment to the frequency for the wireless channel by:
   adjusting a load capacitance of the crystal oscillator.

11. The apparatus as in claim 8, wherein the apparatus further comprises a synthesizer, and wherein the apparatus makes the first adjustment to the frequency for the wireless channel by:
   adjusting a frequency output of the synthesizer.

12. The apparatus as in claim 8, wherein the process when executed is further configured to:
   make the same first and second adjustments to a frequency for a second wireless channel used by the apparatus to communicate with the one or more neighboring devices in the LLN.

13. The apparatus as in claim 12, wherein the wireless channel precedes the second wireless channel in a channel hopping schedule of the apparatus.

14. The apparatus as in claim 8, wherein the apparatus makes the first adjustment to the frequency based on a cubic polynomial that relates frequency error to temperature.

15. A tangible, non-transitory, computer-readable medium storing program instructions that cause a device in a lower-power and lossy network (LLN) to execute a process comprising:
   making, by the device and based on a temperature measurement, a first adjustment to a frequency for a wireless channel used by the device to communicate with one or more neighboring devices in the LLN, wherein routing in the network is performed using a directed acyclic graph (DAG);
   receiving, at the device and via the wireless channel, a first packet from a root node of the DAG, wherein the first packet indicates a transmit frequency for the first packet;
   after making the first adjustment to the frequency for the wireless channel based on the temperature measurement:
      calculating, by the device, a frequency offset based on a difference between the transmit frequency for the first packet received from the root node and the adjusted frequency for the wireless channel, and
      making, by the device and based on the calculated frequency offset, a second adjustment to the frequency for the wireless channel used by the device to communicate with the one or more neighboring devices in the LLN; and
   after making the second adjustment to the frequency for the wireless channel based on the calculated frequency offset:
      sending, by the device, a second packet to a child node of the device according to the DAG, wherein the second packet indicates a transmit frequency for the second packet to enable the child node to make the same second adjustment to a frequency for the wireless channel used by the child node.

* * * * *

UNITED STATES PATENT AND TRADEMARK OFFICE
CERTIFICATE OF CORRECTION

PATENT NO. : 11,031,938 B2
APPLICATION NO. : 16/663644
DATED : June 8, 2021
INVENTOR(S) : Christopher Scott Atherton Cheadle It is certified that error appears in the above-identified patent and that said Letters Patent is hereby corrected as shown below:

In the Specification

Column 12, Line 28, please amend as shown:
frequency offset applied by node 13, $\Delta f_{13}$, may be scaled to Column 14, Line 2, please amend as shown:
thereof. Accordingly, this description is to be taken only by Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*